United States Patent
Nakagawa (10) Patent No.: US 7,265,408 B2
(45) Date of Patent: Sep. 4, 2007

(54) NONVOLATILE SEMICONDUCTOR MEMORY WITH STABLE CHARACTERISTIC

(75) Inventor: Kenichiro Nakagawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 163 days.

(21) Appl. No.: 11/060,386

(22) Filed: Feb. 17, 2005

(65) Prior Publication Data
US 2005/0184333 A1 Aug. 25, 2005

(30) Foreign Application Priority Data
Feb. 19, 2004 (JP) ............................. 2004-043723

(51) Int. Cl.
*H01L 29/788* (2006.01)
(52) U.S. Cl. ...................... 257/314; 257/315; 257/316; 257/324
(58) Field of Classification Search ................ 257/314, 257/315, 316, 324
See application file for complete search history.

(56) References Cited

U.S. PATENT DOCUMENTS 6,906,379 B2 * 6/2005 Chen et al. ................. 257/315

OTHER PUBLICATIONS

Tomoko Ogura, et al., "Embedded Twin MONOS Flash Memories with 4ns and 15ns Fast Access Times", 2003 Symposium on VLSI Circuits Digest of Technical Papers, pp. 207-210.

* cited by examiner

*Primary Examiner*—Douglas W. Owens
(74) *Attorney, Agent, or Firm*—McGinn IP Law Group PLLC (57) ABSTRACT

A nonvolatile semiconductor memory device includes a substrate of a first conductive type, a plurality of stripe-shaped STI (shallow Trench Isolation) films, a plurality of control gates as word lines and a plurality of diffusion layers. The plurality of stripe-shaped STI (shallow Trench Isolation) films are formed in a surface of the substrate to extend in a column direction. The plurality of control gates are formed on the surface of the substrate to extend in a row direction. The plurality of diffusion layers are of a second conductive type and are formed in the surface of the substrate in a region between every two of the plurality of STI films and between every two of the plurality of control gates. A memory cell includes two of the plurality of diffusion layers adjacent in the column direction; and a portion of one of the plurality of control gates between adjacent two of the plurality of STI films corresponding to the adjacent two diffusion layers. The memory cell stores data of two or more bits.

13 Claims, 9 Drawing Sheets

NONVOLATILE SEMICONDUCTOR MEMORY WITH STABLE CHARACTERISTIC

BACKGROUND OF THE INVENTION

1. Field of the Invention

The present invention relates to a nonvolatile semiconductor memory in which data can be written and deleted electrically, and whose memory cell can store 2-bit data.

2. Description of the Related Art

Conventionally, a nonvolatile semiconductor memory was proposed by Ogura, et al. in "Embedded Twin MONOS Flash Memories with 4 ns and 15 ns Fast Access Times", (2003 Symposium on VLSI Circuits Digest of Technical Papers, p. 207-210"). In the proposal, data of two bits or more are stored into one memory cell having the four or more thresholds. Generally, an ONO (Oxide-Nitride-Oxide) film is used as a charge storage layer in such a nonvolatile semiconductor memory of 2-bit/cell type that a storage region is formed on either side of a control gate independently.

Figure 1:
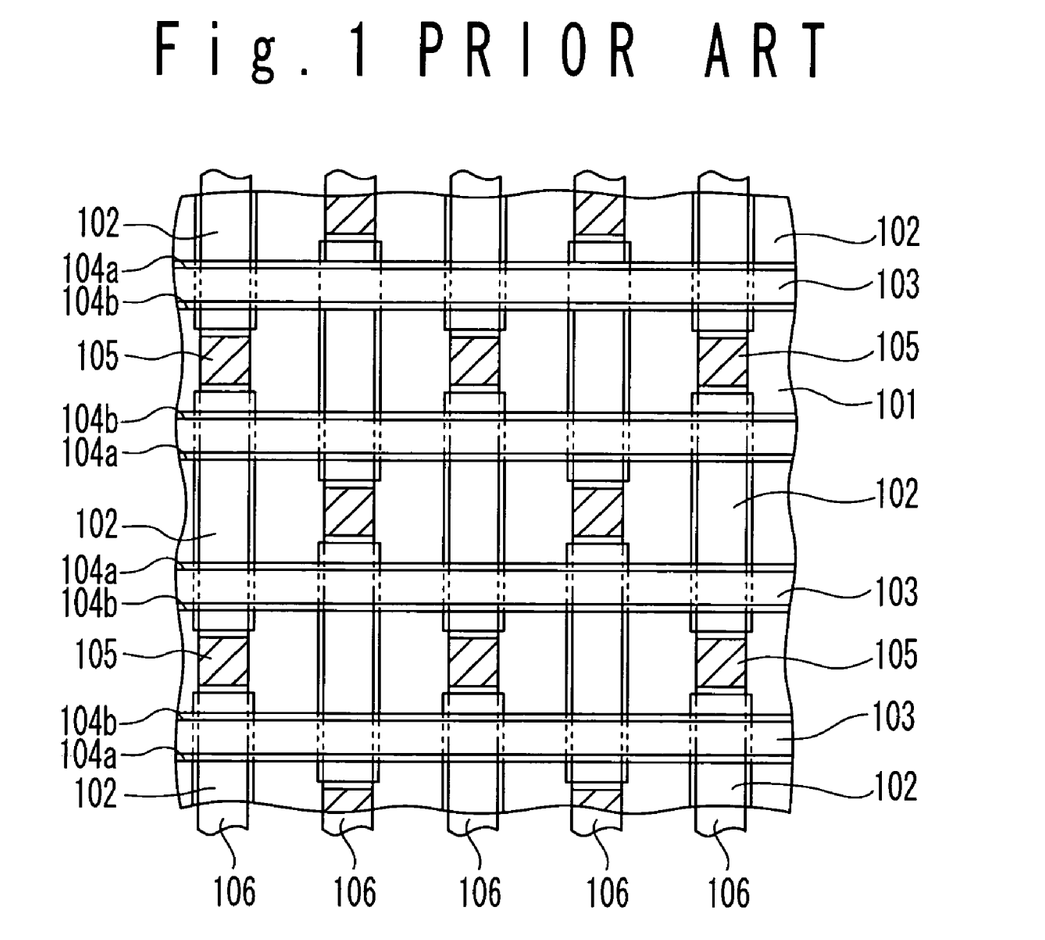
FIG. 1 is a plane view showing a conventional nonvolatile semiconductor memory of a 2-bit/cell type.
Figure 2:
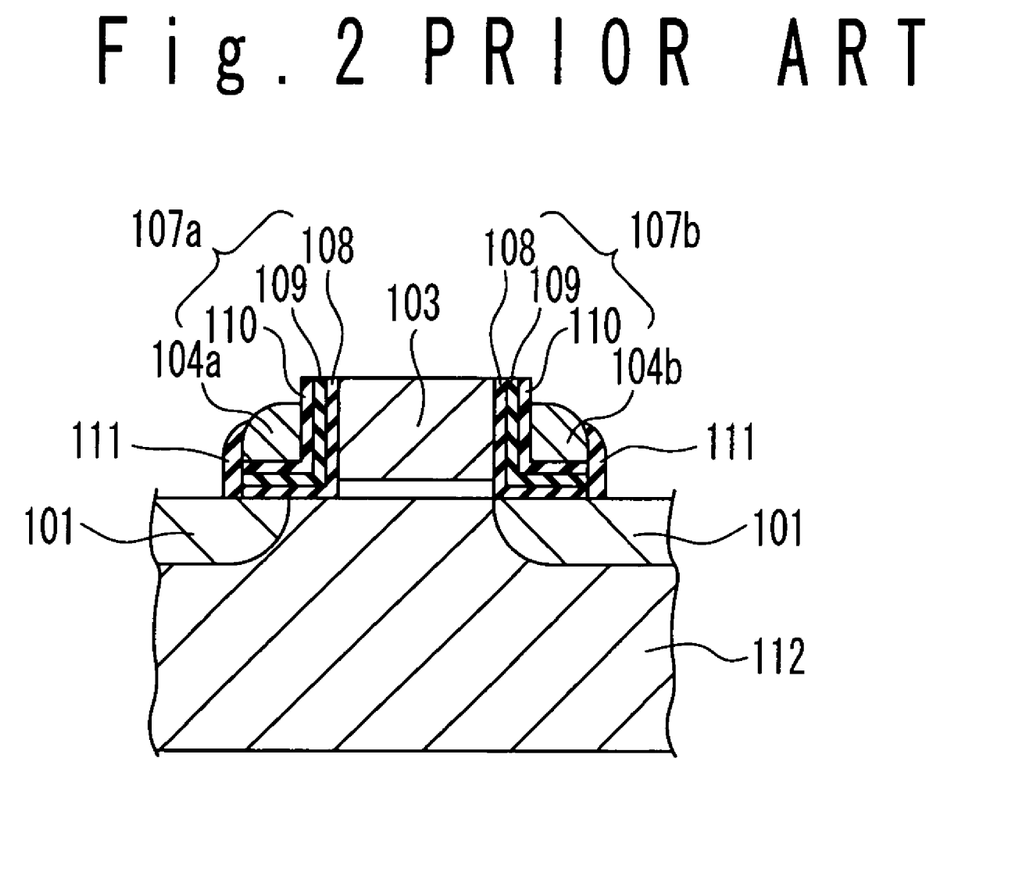
FIG. 2 is a cross-section view showing a cell configuration of the memory shown in FIG. 1.

FIG. 1 is a plane view showing the nonvolatile semiconductor memory of the 2-bit/cell type. FIG. 2 is a cross-section view showing a cell configuration of the memory. As shown in FIGS. 1 and 2, in the conventional nonvolatile semiconductor memory of 2-bit/cell type, STI (shallow Trench Isolation) films 102 are formed on the surface of a silicon substrate 112 in the column direction to have an island structure. A diffusion layer 101 is formed in a region between the STI films 102 adjacent to each other in the column direction on the surface of the silicon substrate 112. The diffusion layers 101 are intermittingly formed in the region between the STI films 102 adjacent to each other in the row direction to put a channel region therebetween. That is, the diffusion layers 101 formed in the row direction to put the STI film 102 therebetween are connected by the diffusion layer 101 formed in the region between the STI films 102 adjacent to each other in the column direction. A contact 105 is formed on the diffusion layer 101 formed in the region between the STI films 102 adjacent to each other in the column direction.

A plurality of control gates 103 are formed on channel regions in the silicon substrate 112 through gate insulating films 113 to extend into the row direction. Charge storage layers 107a and 107b are respectively formed on the both sides of the control gate 103. The storage layers 107a and 107b are formed from ONO films, in which a first silicon oxide 108, a silicon nitride film 109, and second silicon oxide 110 are laminated in this order. Memory gates 104a and 104b are formed on the storage layers 107a and 107b, and sidewalls 111 are formed on the side of the charge storage layer 107a and 107b. In addition, a bit line 106 is formed as an upper layer extending in the column direction and connected with the contact 105.

In this way, in the conventional nonvolatile semiconductor memory of 2-bit/cell type, the memory cells arranged in the row direction are isolated from each other by the STI films 102, and are connected with the bit line 106 in the column direction. Four memory cells share one contact 105. Therefore, it is possible to reduce the size of the memory cell per one bit.

Next, an operation of the conventional nonvolatile semiconductor memory will be described. For instance, high voltages are applied to the control gate and the memory gate in a write operation, the diffusion layers not adjacent is grounded. As a result, channel hot electrons are generated and captured to the silicon nitride film of the charge storage layer. The threshold voltage of the cell transistor is changed by the electrons captured in the charge storage layer. In the read operation, the difference of the threshold voltage is detected.

However, there is a problem described below in the above-mentioned conventional technique. That is, in the conventional nonvolatile semiconductor memory device shown in FIG. 1, the diffusion layer 101 is formed between the STI films 102 arranged into the column direction and the bit line 106 is formed to extend in the column direction. The contacts 105 are formed on the diffusion layers 101. For this reason, the device separation film 102 must be formed like an island. When the device isolation is carried out by use of an STI method, it is difficult to form the STI film 102 with a rectangular shape, viewing from the above, and the corner sometimes becomes round. When the memory gate is arranged on the round corner of the STI film 102, a deviation in characteristic of the memory cell is caused due to variance in the manufacturing process.

SUMMARY OF THE INVENTION

In an aspect of the present invention, a nonvolatile semiconductor memory device includes a substrate of a first conductive type, a plurality of stripe-shaped STI (shallow Trench Isolation) films, a plurality of control gates as word lines and a plurality of diffusion layers. The plurality of stripe-shaped STI (shallow Trench Isolation) films are formed in a surface of the substrate to extend in a column direction. The plurality of control gates are formed on the surface of the substrate to extend in a row direction. The plurality of diffusion layers are of a second conductive type and are formed in the surface of the substrate in a region between every two of the plurality of STI films and between every two of the plurality of control gates. A memory cell includes two of the plurality of diffusion layers adjacent in the column direction; and a portion of one of the plurality of control gates between adjacent two of the plurality of STI films corresponding to the adjacent two diffusion layers. The memory cell stores data of two or more bits.

Here, the nonvolatile semiconductor memory device may further include a charge storage layer formed between each row of the plurality of diffusion layers and one of the plurality of control gates corresponding to the row of the plurality of diffusion layers to store the 1-bit data in the memory cell; and a memory gate formed on a side of the charge storage layer.

Also, the nonvolatile semiconductor memory device may further include a charge storage layer formed between each row of the plurality of diffusion layers and one of the plurality of control gates corresponding to the row of the plurality of diffusion layers to store the 1-bit data in the memory cell; a memory gate formed on a side of the charge storage layer; and a conductive film formed on each of the plurality of control gates to connect the control gate and the memory gates on both sides of the control gate.

Further, the nonvolatile semiconductor memory device may further include a gate insulating film as a charge storage layer formed between each of the plurality of control gates and the substrate to store the 2-bit data in the memory cell.

Also, the nonvolatile semiconductor memory device may further include a plurality of wiring lines, each of which is provided for every two of the plurality of diffusion layers adjacent in the row direction to connect the adjacent two diffusion layers, and a plurality of bit lines provided to extend in the column direction, wherein each of the plurality of bit lines is connected with one of every two of the plurality of wiring lines in the column direction. The plurality of wiring lines are preferably formed such that other two diffusion layers of the two memory cells having the two diffusion layers are different two of the plurality of wiring lines.

In this case, each of the plurality of wiring lines is preferably provided above a region between two of the plurality of control gates corresponding to the wiring line. Also, one of adjacent two rows of the plurality of wiring lines is preferably shifted in the row direction for one diffusion layer. Also, the plurality of bit lines are preferably provided above the plurality of STI films.

Also, the nonvolatile semiconductor memory device may further include a plurality of first contacts, one of which is provided for each of the plurality of diffusion layers to connect the diffusion layer with one of the plurality of wiring lines corresponding to the diffusion layer; and a plurality of second contacts, one of which is provided for each of the plurality of wiring lines to connect the wiring line with one of the plurality of bit lines corresponding to the wiring line. In this case, each of the plurality of second contacts is preferably provided above one of the plurality of STI films corresponding to the second contact.

Also, the charge storage layer may include a layer of a first silicon oxide film, a silicon nitride film and a second silicon oxide film stacked in this order. Also, the charge storage layer may include a layer of a first silicon oxide film, a dielectric film and a second silicon oxide film stacked in this order, and the dielectric film has a dielectric constant larger than the silicon oxide. Further, the charge storage layer may include an insulating film in which conductive particles are dispersed.

DESCRIPTION OF THE PREFERRED EMBODIMENTS

Hereinafter, a nonvolatile semiconductor memory of the present invention will be described in detail with reference to the attached drawings.

Figure 3:
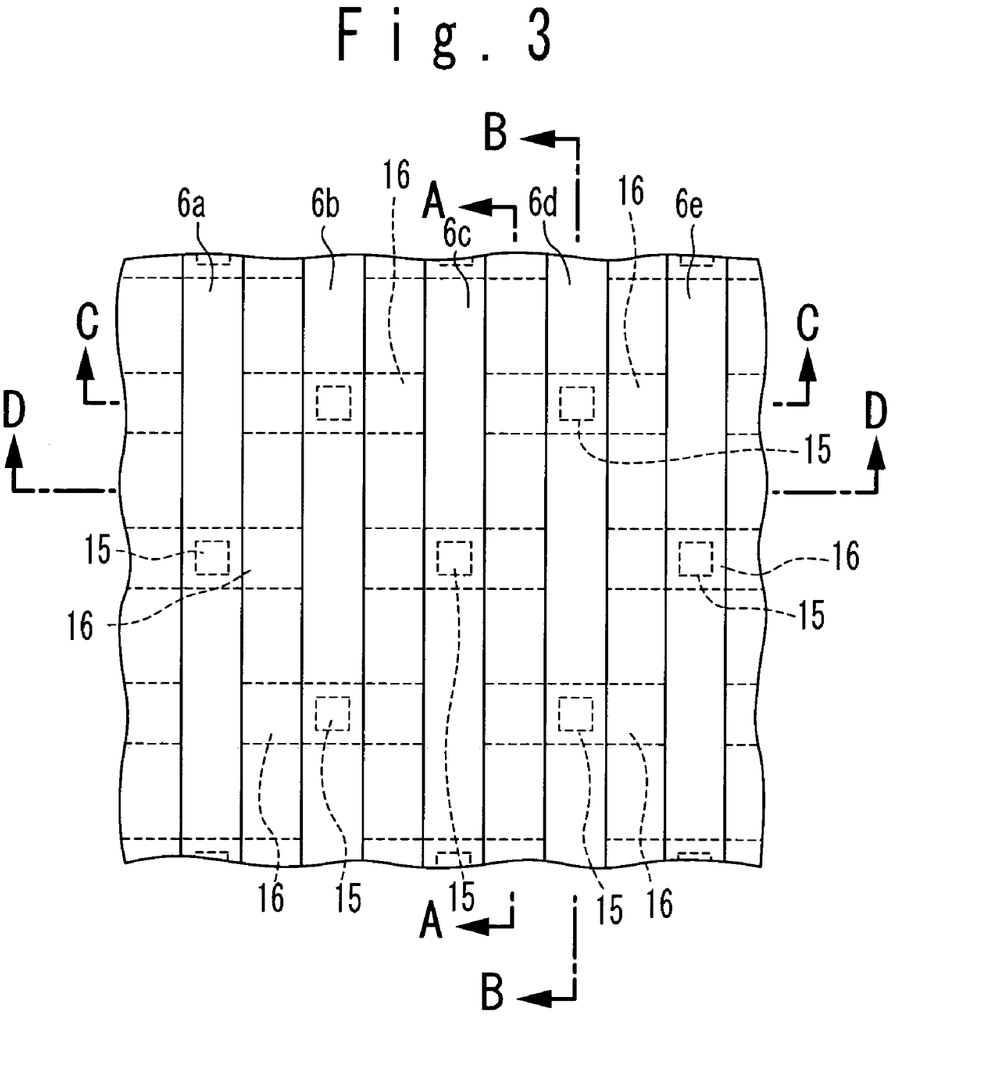
FIG. 3 is a plane view showing a layout of a layer including bit lines in a nonvolatile semiconductor memory according to a first embodiment of the present invention.
Figure 4:
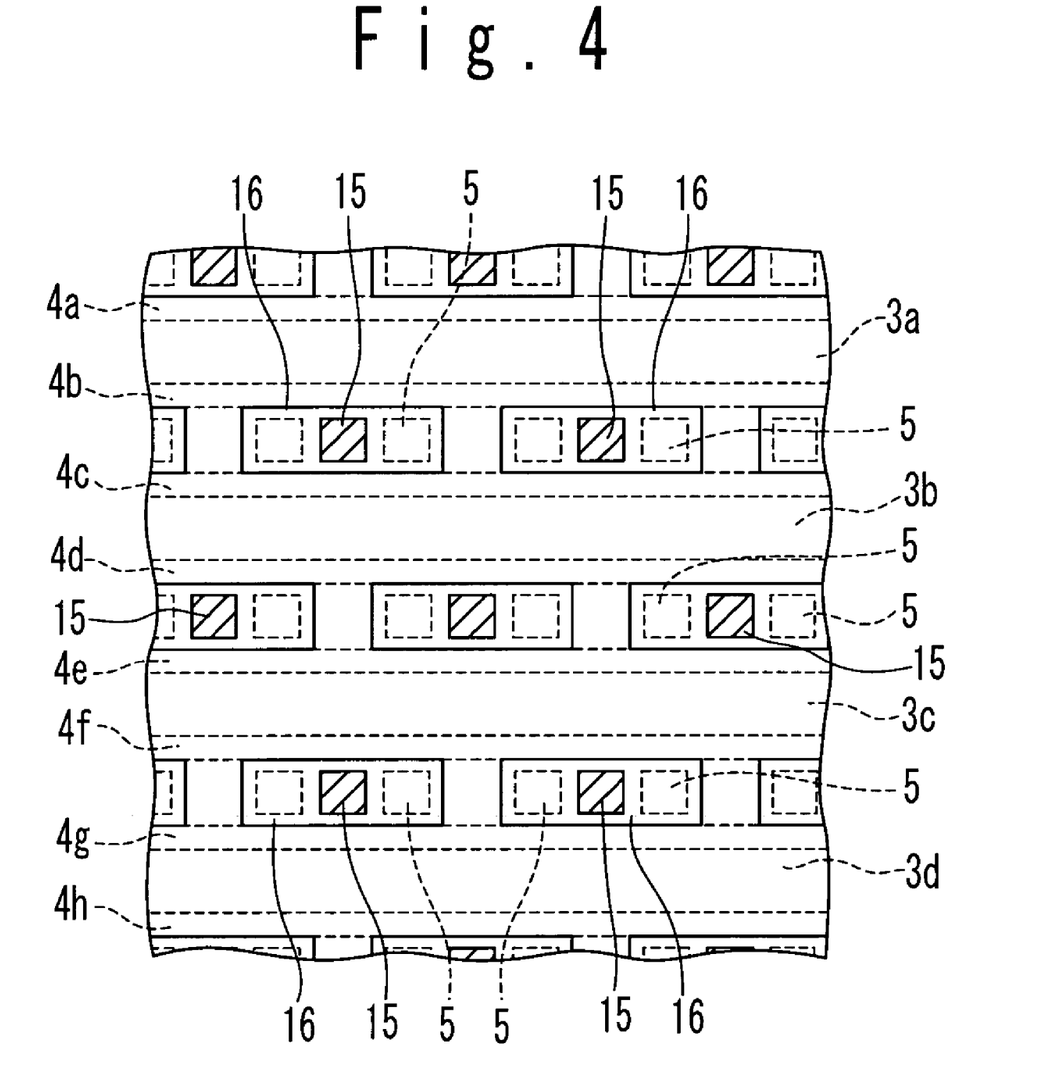
FIG. 4 is a plane view showing a layout of a wiring layer under the layer shown in FIG. 3.
Figure 5:
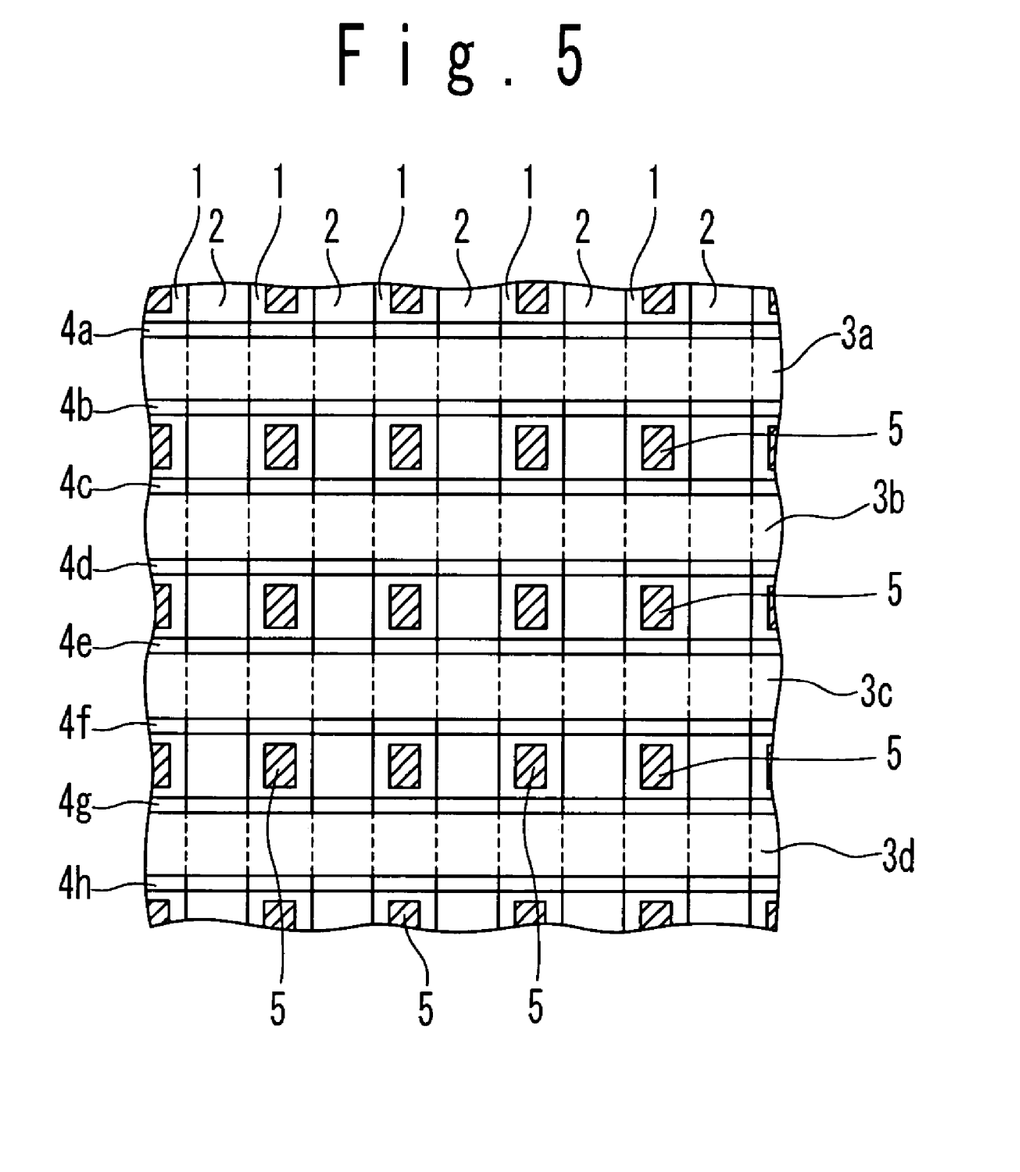
FIG. 5 is a plane view showing a layout of control gates and diffusion layers under the layer shown in FIG. 4.

FIGS. 3 to 5 are plane views showing layouts of the nonvolatile semiconductor memory according to the first embodiment of the present invention. FIGS. 6 to 9 are cross sectional views of the nonvolatile semiconductor memory according to the first embodiment of the present invention.

In the nonvolatile semiconductor memory of the first embodiment, STI films 2 are formed in a surface portion of a first conductive type substrate 12 of silicon to have a stripe shape and to extend in a column direction, as shown in FIG. 5 and FIGS. 6 to 9. A plurality of control gates 3a to 3d as word lines are formed on the first conductive type substrate 12 and the STI films 2 through gate insulating films 13 to extend in a row direction such that the control gates 3a to 3d are orthogonal to the STI films 2, as shown in FIG. 5 and FIGS. 6 to 9. A second conductive type diffusion layer 1 is formed between the two STI films 2 and between channel regions under the two control gates 3a. That is to say, the second conductive type diffusion layer 1 and the channel region are alternately formed between the STI films 2 in the first conductive type substrate 12 in the column direction.

Figure 6:
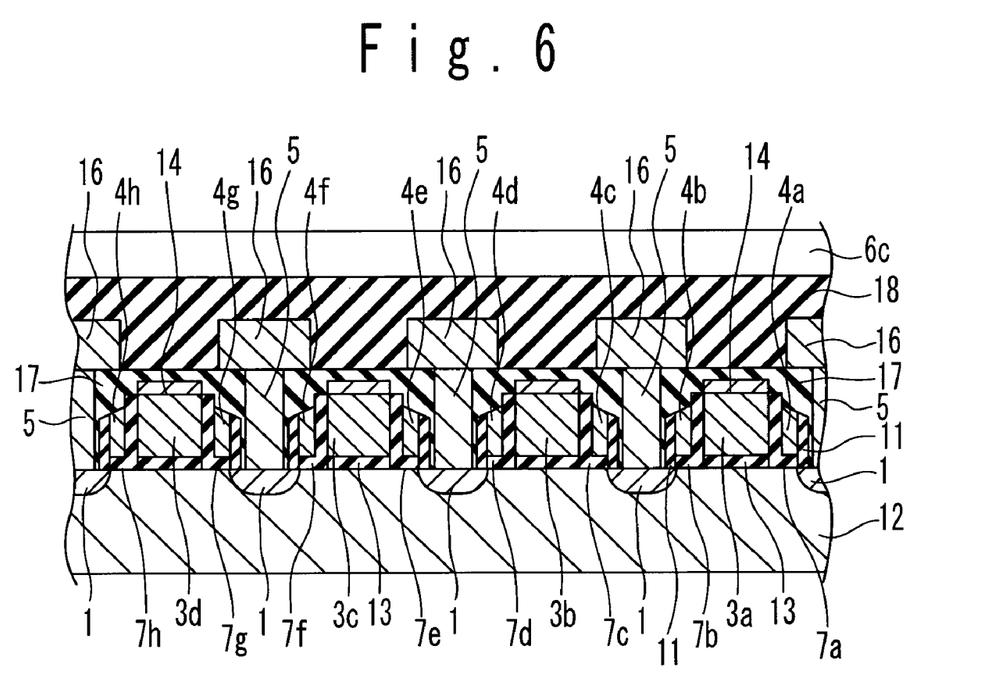
FIG. 6 is a cross sectional view of the nonvolatile semiconductor memory along the line A-A' shown in FIG. 3.
Figure 7:
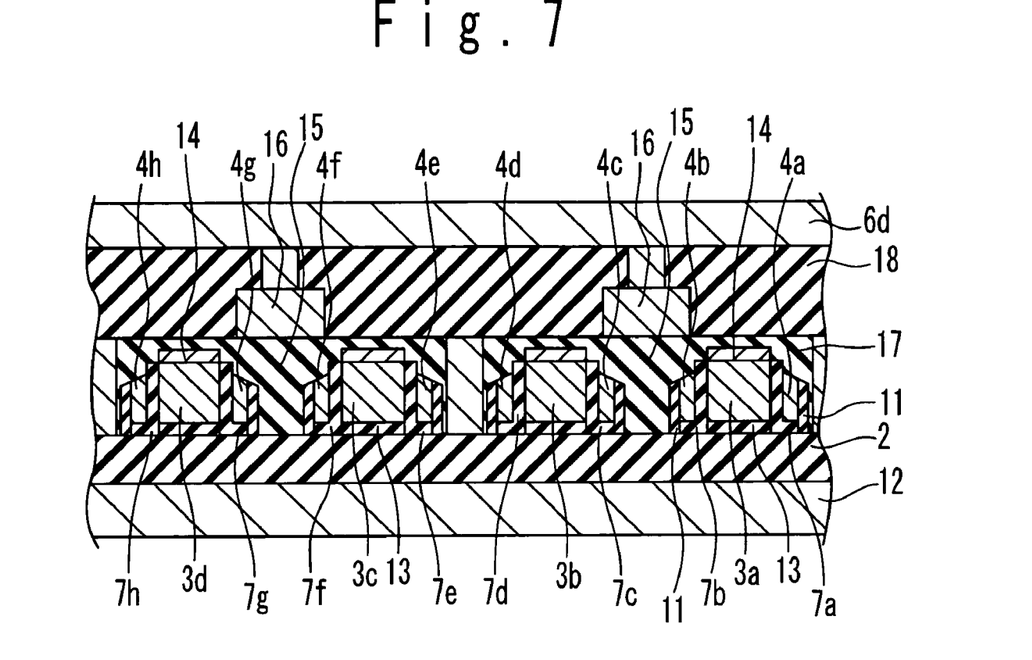
FIG. 7 is a cross sectional view of the nonvolatile semiconductor memory along the line B-B' shown in FIG. 3.

Also, two of charge storage layers 7a to 7h are formed on both sides of each of the control gates 3a to 3d, respectively, as shown in FIGS. 5 to 7. Each of the charge storage layers 7a to 7b functions as a storage unit to store data. The charge storage layers 7a to 7h may be formed from an ONO stack film in which a silicone oxide film 8, a silicon nitride film 9, and a second silicone oxide film 10 are stacked in this order. In addition, memory gates 4a to 4h are formed on horizontally extending portions of the charge storage layers 7a to 7h, to contact vertical surfaces of the charge storage layers 7a to 7h, respectively. A sidewall 11 is formed on a side of each of the charge storage layers 7a to 7h to cover an upper surface and side surface of the memory gate. Further, a conductive layer 14 may be formed of silicide on each of the control gates 3a to 3d.

In the nonvolatile semiconductor memory of the first embodiment, a pair of the second conductive type diffusion layers 1 putting the channel region therebetween function as source/drain regions, and form a second conductive type transistor together with the gate insulating film 13 and the control gate. A plurality of the memory cells, each of which includes the second conductive type transistor, are arranged in a matrix. Therefore, in the nonvolatile semiconductor memory of the first embodiment, the source/drain regions are shared by the memory cells adjacent to each other in the column direction.

Figure 8:
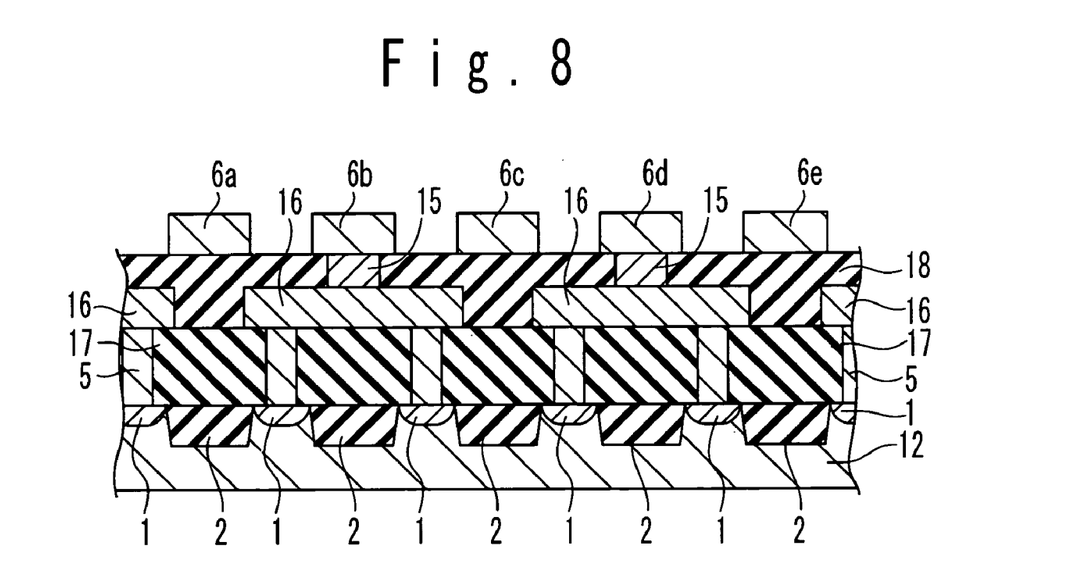
FIG. 8 is a cross sectional view of the nonvolatile semiconductor memory along the line C-C' shown in FIG. 3.
Figure 9:
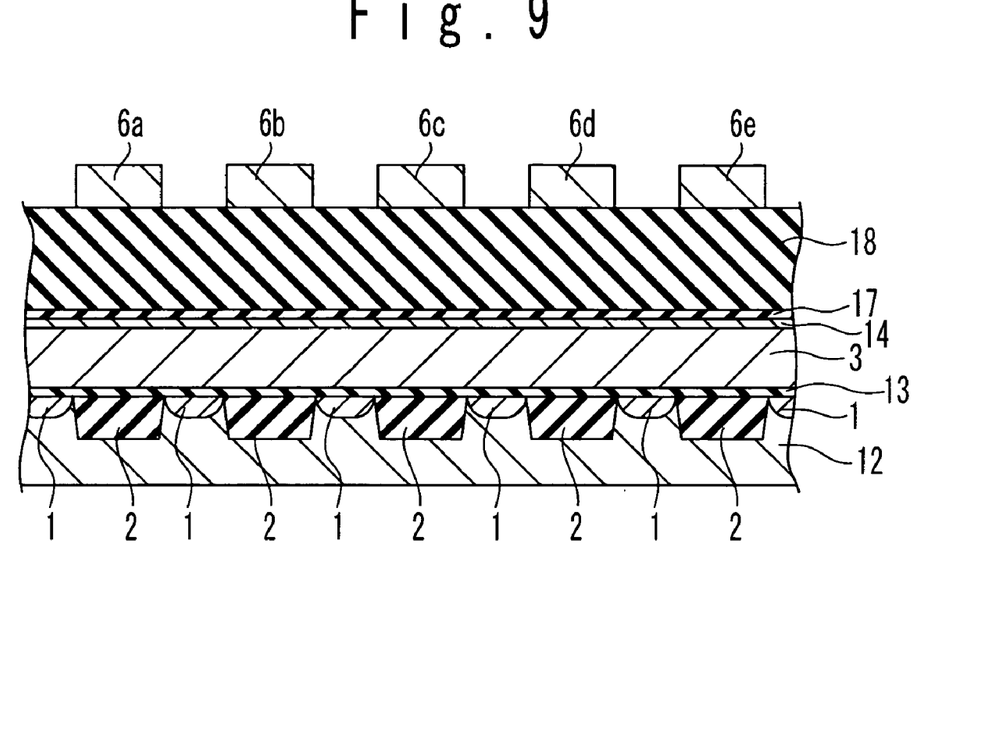
FIG. 9 is a cross sectional view of the nonvolatile semiconductor memory along the line D-D' shown in FIG. 3.

In the nonvolatile semiconductor memory of the first embodiment, a first interlayer insulating film 17 is formed on the first conductive type substrate 12 to cover the memory cells with the above-mentioned structure. A plurality of contacts 5 are formed on each second conductive type diffusion layer 1 to pass through the first interlayer insulating film 17 to the second conductive type diffusion layer 1. As shown in FIGS. 4 and 8, a first wiring line 16 is formed on the first interlayer insulating film 17 above the region between the control gates the to connect two of the contacts 5 adjacent in the row direction. That is to say, a pair of the second conductive type diffusion layers 1 are connected with the first wiring line 16 through the contacts 5 to put the STI film 2 therebetween. In this case, the diffusion layers 1 of the row adjacent in the column direction which correspond to the diffusion layers 1 connected with the first wiring line 16 are connected with other different first wiring lines 16, as shown in FIG. 4.

In addition, a second interlayer insulating film 18 is formed on the interlayer insulating film 17 to cover the first wiring lines 1, as shown in FIGS. 6 to 9. A via-contact 15 is formed on the first wiring line 16 directly above the STI film 2 to pass through the second interlayer insulating film 18 to the first wiring line 16. As a result, a pitch between the via-contacts 15 in the row direction is twice the pitch between the control gates 3a to 3d in the row direction.

Furthermore, as shown in FIG. 3, wiring lines 6a to 6e as bit lines are formed on the second interlayer insulating film 18 to extend in the column direction. Each of the wiring lines 6a to 6e is connected with the via-contacts 15 arranged in column direction. That is, the via-contacts 15 adjacent to in the row direction are connected with different bit lines, between two of which one bit line is arranged. Thus, in the nonvolatile semiconductor memory of the first embodiment, the second conductive type diffusion layer 1 is connected with one of the second wiring lines 6a to 6e through the contact 5, the first wiring line 16, and the via-contact 15. A pair of the second conductive type diffusion layers 1 putting the channel region therebetween are connected with the different two of the second wiring lines 6a to 6e.

As mentioned above, in the nonvolatile semiconductor memory of the first embodiment, the STI film 2 has the stripe shape, so that the memory cells are formed easily and stably. For this reason, it is possible to prevent variance in characteristic of each memory cell due to the variance in the shape of the devise isolation film. Therefore, the operation of the memory cell is stabilized. Further, no regional limitation in the formation of the charge storage layers 7a to 7h improves the flexibility of designing.

Furthermore, in the nonvolatile semiconductor memory of the first embodiment, the number of layers is smaller than the number of layers in a logic circuit. Therefore, it is possible to apply the nonvolatile semiconductor to an application using the logic circuit.

Next, an operation of the nonvolatile semiconductor memory of the first embodiment is described below. First, in a write operation in the charge storage layer 7c, the voltage of 5.5V is applied to the memory gate 4c and the voltage of 3.3V is applied to the memory gate 4d, 0.8V is applied to the control gate 3b. The voltage of 4.5V is applied to the second wiring line 6d, and the second wiring line 6e is grounded. As a result, hot electrons are generated in the channel region, and are captured by the silicon nitride film of the charge storage layer 7c. The threshold voltage of the transistor of the memory cell changes due to the hot electrons captured by the charge storage layer 7c. At this time, a non-selection bit line (the second wiring line 6c) adjacent to the selection bit line (the second wiring line 6d) on the drain side is opened or applied with an inhibition voltage, i.e., the lower voltage of about 2V than that of the selection bit line, to prevent current flow.

Also, in an erase operation, a negative voltage of about −3 V is applied to the memory gate 4c, and the voltage about 4V is applied to the second conductive type diffusion layer 1 adjacent to the deleted charge storage layer 7c. As a result, hot holes of pairs of electron and hole generated due to interband tunneling are injected into the memory region.

Further, in a read operation, the difference of the threshold voltage of the charge storage layer 7c is detected. Specifically, the positive voltage of about 0.8V is applied to the control gate 3b, and the voltage of 1.5V (the lower voltage than in the write operation) is applied to the second wiring line 6d as the selection bit line on the drain side. Also, the second wiring line 6e as the selection bit line on the source side is grounded. At this time, the non-selection bit line adjacent to the selection bit line 6c on the drain side and is opened.

Figure 10:
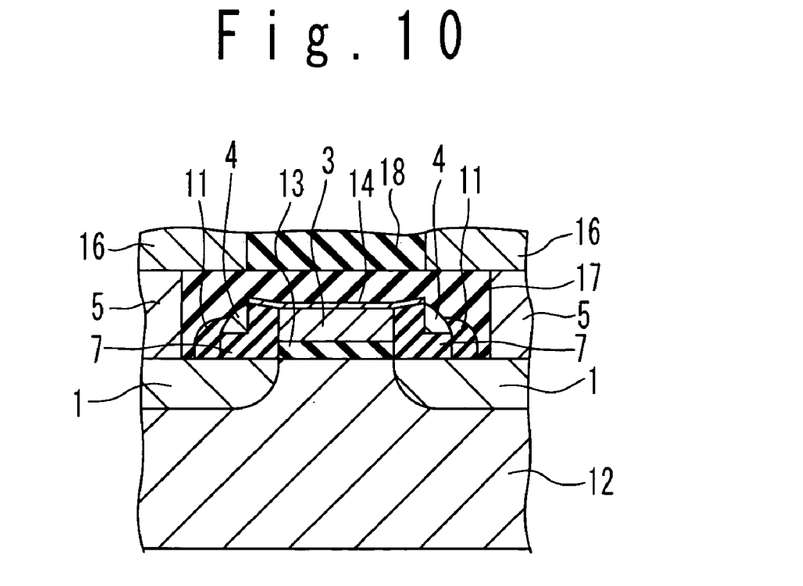
FIG. 10 is a cross-section views showing the nonvolatile semiconductor memory according to a second embodiment of the present invention.
Figure 11:
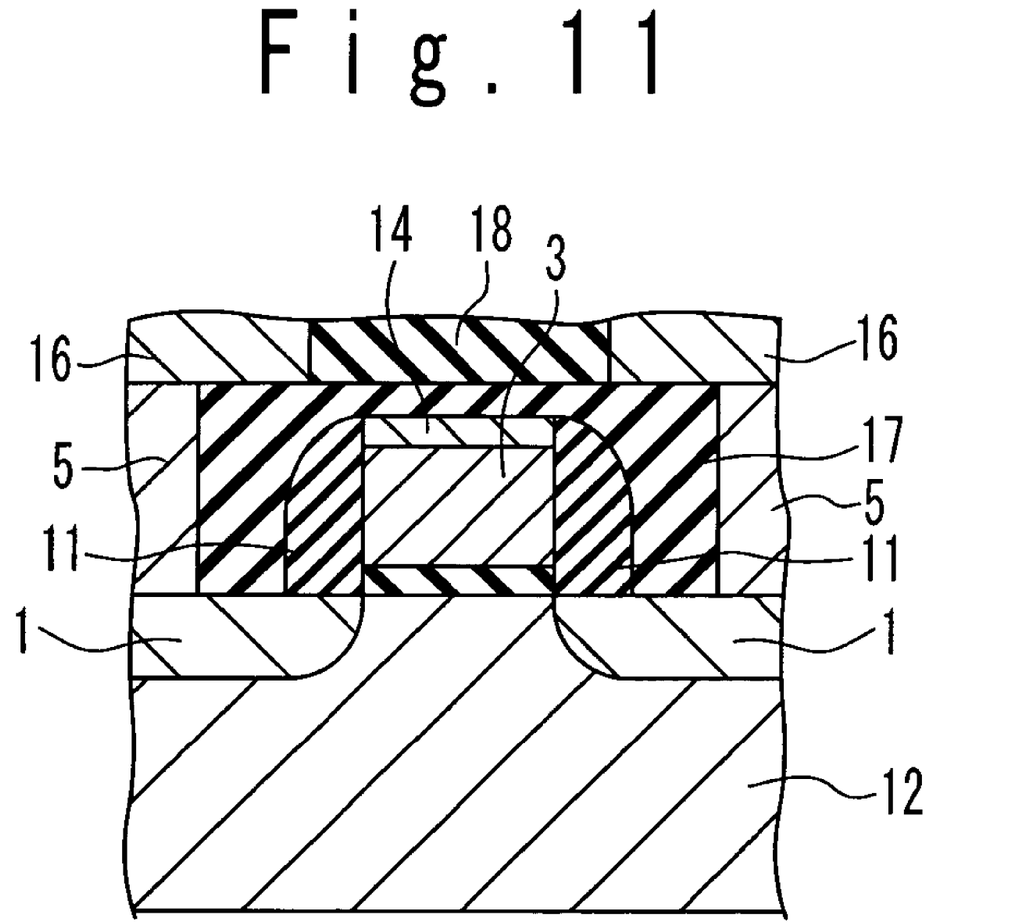
FIG. 11 is a cross-section view showing the nonvolatile semiconductor memory according to a third embodiment of the present invention.

In the nonvolatile semiconductor memory of the first embodiment, the ONO film is provided on either side of the control gate. However, the present invention is not limited to this configuration, and the cell configuration is sufficient that the data of 2 bits or more can be stored in one memory cell. FIGS. 10 and 11 are cross-section views showing the nonvolatile semiconductor memory according to the second and third embodiments of the present invention.

In the memory cell shown in FIG. 10, the control gate 3 is formed above the channel region in the surface portion of the first conductive type substrate 12 through the gate insulating film 7. The charge storage layer 7 is formed from the ONO film on the either side of the control gate 3. Moreover, the memory gate 4 is formed on the side of the charge storage layer 7, and the sidewall 11 is formed on the side surface of the charge storage layer 7. In addition, the second conductive type diffusion layer 1 is formed in the surface portion of the first conductive type substrate 12 under the sidewall 11. The control gate 3 and a pair of the memory gates 4 putting the control gate 3 therebetween are electrically connected by the conductive layer 14. At this time, a voltage applied to the conductive layer 14 is adequately adjusted. In this way, by electrically connecting the control gate 3 and the pair of the memory gates 4, the number of wiring lines decreases, and a control is simplified at the time of operation.

In the memory cell of the third embodiment shown in FIG. 11, the charge storage layer 7 is formed from the ONO film on the channel region in the surface portion of the first conductive type substrate 12. The control gate 3 is formed on the charge storage layer 7. Moreover, the conducting layer 14 is formed on the control gate 3. The sidewalls 11 are formed on both sides of the charge storage layer 7 and the control gate 3. In addition, the second conductive type diffusion layer 1 is formed under the sidewall 11 in the surface portion of the first conductive type substrate 12. By such configuration of the memory cell as mentioned above, the manufacturing becomes easy, and 2-bit/cellular nonvolatile memory can be manufactured in low cost.

Also, the charge storage layer may be formed from a layer of a first silicon oxide film, a dielectric film and a second silicon oxide film stacked in this order. In this case, the dielectric film preferably has a dielectric constant larger than said silicon oxide.

Also, the charge storage layer may be formed from an insulating film in which conductive particles are dispersed.

As described above, according to the present invention, the STI film 2 has the stripe shape with a rectangular cross section. Therefore, there is no case that the STI film 2 is formed under the charge storage layer 7, unlike the conventional nonvolatile semiconductor memory. Thus, the characteristics of the memory cell is stabilized.

What is claimed is:

1. A nonvolatile semiconductor memory device comprising:
   a substrate of a first conductive type;
   a plurality of stripe-shaped STI (shallow Trench Isolation) films formed in a surface of said substrate to extend in a column direction;
   a plurality of control gates as word lines formed on the surface of said substrate to extend in a row direction;

a plurality of diffusion layers of a second conductive type
formed in the surface of said substrate in a region
between every two of said plurality of STI films and
between every two of said plurality of control gates;

a memory cell, comprising:
two of said plurality of diffusion layers adjacent in the
column direction;
a portion of one of said plurality of control gates
between adjacent two of said plurality of STI films
corresponding to said adjacent two diffusion layers,
and said memory cell stores data of two or more bits;

a charge storage layer configured to store data of one or
more bits in said memory cell;

a plurality of wiring lines, each of which is provided for
every two of said plurality of diffusion layers adjacent
in the row direction to connect said adjacent two
diffusion layers, wherein said plurality of wiring lines
are formed such that other two diffusion layers of said
two memory cells having said two diffusion layers are
different two of said plurality of wiring lines; and a plurality of bit lines provided to extend in the column
direction, wherein each of said plurality of bit lines is
connected with one of every two of said plurality of
wiring lines in the column direction.

2. The nonvolatile semiconductor memory device according to claim 1, wherein said charge storage layer is formed between each row of said plurality of diffusion layers and one of said plurality of control gates corresponding to said row of said plurality of diffusion layers, said nonvolatile semiconductor memory device further comprises a memory gate formed on a side of said charge storage layer to control said charge storage layer.

3. The nonvolatile semiconductor memory device according to claim 1, wherein said charge storage layer is formed between each row of said plurality of diffusion layers and one of said plurality of control gates corresponding to said row of said plurality of diffusion layers, said nonvolatile semiconductor memory device further comprises:
a memory gate formed on a side of said charge storage layer to control said charge storage layer; and
a conductive film formed on each of said plurality of control gates to connect said control gate and said memory gates on both sides of said control gate.

4. The nonvolatile semiconductor memory device according to claim 1, further comprising:
a gate insulating film as a charge storage layer formed between each of said plurality of control gates and said substrate to store the 2-bit data in said memory cell.

5. The nonvolatile semiconductor memory device according to claim 1, wherein said charge storage layer comprises:
a layer of a first silicon oxide film, a silicon nitride film and a second silicon oxide film stacked in this order.

6. The nonvolatile semiconductor memory device according to claim 1, wherein said charge storage layer comprises:
a layer of a first silicon oxide film, a dielectric film and a second silicon oxide film stacked in this order, and
said dielectric film has a dielectric constant larger than said silicon oxide.

7. A nonvolatile semiconductor memory device comprising:
a substrate of a first conductive type;
a plurality of stripe-shaped STI (shallow Trench Isolation) films formed in a surface of said substrate to extend in a column direction;
a plurality of control gates as word lines formed on the surface of said substrate to extend in a row direction; and
a plurality of diffusion layers of a second conductive type formed in the surface of said substrate in a region between every two of said plurality of STI films and between every two of said plurality of control gates;

a memory cell, comprising:
two of said plurality of diffusion layers adjacent in the column direction; and
a portion of one of said plurality of control gates between adjacent two of said plurality of STI films corresponding to said adjacent two diffusion layers, and said memory cell stores data of two or more bits;

a plurality of wiring lines, each of which is provided for every two of said plurality of diffusion layers adjacent in the row direction to connect said adjacent two diffusion layers, wherein said plurality of wiring lines are formed such that other two diffusion layers of said two memory cells having said two diffusion layers are different two of said plurality of wiring lines; and a plurality of bit lines provided to extend in the column direction, wherein each of said plurality of bit lines is connected with one of every two of said plurality of wiring lines in the column direction.

8. The nonvolatile semiconductor memory device according to claim 7, wherein each of said plurality of wiring lines is provided above a region between two of said plurality of control gates corresponding to said wiring line.

9. The nonvolatile semiconductor memory device according to claim 7, wherein a first wiring line of adjacent two rows of said plurality of wiring lines is spaced apart from a second wiring line of the adjacent two rows of said plurality of wiring lines in the row direction by one diffusion layer.

10. The nonvolatile semiconductor memory device according to claim 7, wherein said plurality of bit lines are provided above said plurality of STI films.

11. The nonvolatile semiconductor memory device according to claim 7, further comprising:
a plurality of first contacts, one of which is provided for each of said plurality of diffusion layers to connect said diffusion layer with one of said plurality of wiring lines corresponding to said diffusion layer; and
a plurality of second contacts, one of which is provided for each of said plurality of wiring lines to connect said wiring line with one of said plurality of bit lines corresponding to said wiring line.

12. The nonvolatile semiconductor memory device according to claim 11, wherein each of said plurality of second contacts is provided above one of said plurality of STI films corresponding to said second contact.

13. A nonvolatile semiconductor memory device comprising:
a substrate of a first conductive type;
a plurality of stripe-shaped STI (shallow Trench Isolation) films formed in a surface of said substrate to extend in a column direction;
a plurality of control gates as word lines formed on the surface of said substrate to extend in a row direction;
a plurality of diffusion layers of a second conductive type formed in the surface of said substrate in a region between every two of said plurality of STI films and between every two of said plurality of control gates;

a memory cell, comprising:
two of said plurality of diffusion layers adjacent in the column direction;
a portion of one of said plurality of control gates between adjacent two of said plurality of STI films corresponding to said adjacent two diffusion layers, and
said memory cell stores data of two or more bits;
a charge storage layer configured to store data of one or more bits in said memory cell; and
an insulating film in which conductive particles are dispersed.

* * * * *